United States Patent
Yang

(10) Patent No.: US 8,324,048 B2
(45) Date of Patent: *Dec. 4, 2012

(54) METAL CAPACITOR AND METHOD OF MAKING THE SAME INCLUDING DIELECTRIC LAYER OF DIFFERENT MECHANICAL STRENGTH AND DIELECTRIC CONSTANT REGIONS

(75) Inventor: Chin-Sheng Yang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/342,109

(22) Filed: Jan. 1, 2012

(65) Prior Publication Data

US 2012/0115301 A1    May 10, 2012

Related U.S. Application Data

(63) Continuation of application No. 12/255,652, filed on Oct. 21, 2008, now Pat. No. 8,114,734.

(51) Int. Cl.
 H01L 21/8242 (2006.01)
 H01L 21/20 (2006.01)
 H01L 21/4763 (2006.01)
(52) U.S. Cl. ............... 438/250; 438/396; 438/638

(58) Field of Classification Search .......... 438/250, 438/396, 638; 257/E29.343, E21.011
See application file for complete search history.

(56) References Cited

U.S. PATENT DOCUMENTS

| | | | |
|---|---|---|---|
| 5,583,359 A | 12/1996 | Ng | |
| 6,159,752 A | 12/2000 | Katoh | |
| 7,049,246 B1 | 5/2006 | Liu | |
| 2004/0058090 A1 | 3/2004 | Waldfried et al. | |
| 2006/0189069 A1 | 8/2006 | Coolbaugh | |
| 2007/0034988 A1 | 2/2007 | Won | |
| 2007/0243720 A1 | 10/2007 | Ko et al. | |
| 2008/0012092 A1 | 1/2008 | Liang | |

OTHER PUBLICATIONS

Kazuo Maeda et al., "UV Annealing Process for Modifying Properties of Low k Films", 2004, p. 1-5, 2004 Semiconductor Equipment and Materials.

*Primary Examiner* — William M. Brewster
(74) *Attorney, Agent, or Firm* — Winston Hsu; Scott Margo

(57) ABSTRACT

A method of making a metal capacitor includes the following steps. A dielectric layer having a dual damascene metal interconnection and a damascene capacitor electrode is provided. Then, a treatment is performed to increase the dielectric constant of the dielectric layer surrounding the damascene capacitor electrode. The treatment can be UV radiation, a plasma treatment or an ion implantation. Accordingly, the metal capacitor will have a higher capacitance and RC delay between the dual damascene metal interconnection and the dielectric layer can be prevented.

12 Claims, 3 Drawing Sheets

METAL CAPACITOR AND METHOD OF MAKING THE SAME INCLUDING DIELECTRIC LAYER OF DIFFERENT MECHANICAL STRENGTH AND DIELECTRIC CONSTANT REGIONS

CROSS REFERENCE TO RELATED APPLICATIONS

This is a continuation application of U.S. patent application Ser. No. 12/255,652, filed on Oct. 21, 2008 (now issued as U.S. Pat. No. 8,114,734), and all benefits of such earlier application are hereby claimed for this new continuation application.

BACKGROUND OF THE INVENTION

1. Field of the Invention

The present invention is related to a metal capacitor and a method of making the same, and more particularly, to a structure and a method of improving the capacitance of a metal-oxide-metal (MOM) capacitor.

2. Description of the Prior Art

As the complexity and integration of integrated circuits continues to increase, the size of semiconductor elements becomes smaller and smaller. This has led to a reduction in the overall size of capacitors with the result that the corresponding capacitance is also reduced. Generally, there are three effective ways to improve the capacitance through circuit design. The first way is to decrease the separation between the capacitor electrodes. The second way is to increase the surface area of each capacitor electrode. The third way is to use a dielectric material with a high dielectric constant in the capacitor dielectric layer.

Commonly used capacitors include the metal-insulator-metal (MIM) capacitor, metal-oxide-metal (MOM) capacitor and metal-insulator-silicon (MIS) capacitor. The fabricating process of a MOM capacitor can be integrated with the interconnect process; hence no extra photomask is required. Therefore, the MOM capacitor is the most commonly used capacitor in the semiconductor field.

Methods to increase the capacitance of the MOM capacitor are well-known in the art: for instance, arranging the capacitor electrodes in a stack structure to replace the planar capacitors or placing the capacitor electrodes in a comb-like structure to increase the surface area of the capacitor electrode. However, because modern electronic devices are built at the nano scale, the size of the MOM capacitor has to be scaled down. Under this condition, increasing the surface area of the MOM capacitor electrode can no longer provide enough capacitance.

As mentioned above, besides the surface area of the capacitor electrode, the capacitance of the capacitor is also in direct proportion to the dielectric constant of the capacitor dielectric layer. Therefore, increasing the dielectric constant of the capacitor dielectric layer is another possible way to improve the capacitance of the MOM capacitor.

However, in order to avoid RC delay and parasitic capacitance, a metal wire with a low resistance is used in the metal interconnection and a dielectric layer with low dielectric constant is positioned between the metal wires. To integrate the interconnect process, the MOM capacitor and the metal interconnection are usually formed in the same dielectric layer. That is, the MOM capacitor is formed in the dielectric layer with low dielectric constant in order to integrate the fabricating process and avoid RC delay. This, however, results in the capacitance of the MOM capacitor being compromised.

Therefore, the reduced surface area of the capacitor electrode and the low dielectric constant of the capacitor dielectric layer deteriorate the capacitance of the MOM capacitor. Accordingly, a method of fabricating a metal capacitor which can both overcome the RC delay and improve the capacitance is demanded.

SUMMARY OF THE INVENTION

Therefore, an object of the present invention is to provide a capacitor structure and a method of making the same to maintain the capacitance when the MOM capacitor is scaled down.

According to a preferred embodiment of the present invention, a method of forming a metal capacitor is disclosed. The method includes the steps of: providing a dielectric layer having a first region and a second region; after forming the dielectric layer forming a dual damascene metal interconnection in the first region and forming a damascene capacitor electrode in the second region; and performing a treatment on the dielectric layer in the second region to make a dielectric constant of the dielectric layer in the second region higher than a dielectric constant of the dielectric layer in the first region.

According to anther preferred embodiment of the present invention, a metal capacitor structure comprises: a dielectric layer having a first region and a second region, wherein a dielectric constant of the dielectric layer in the second region is higher than a dielectric constant of the dielectric layer in the first region; a metal interconnection positioned in the first region; and a capacitor electrode positioned in the second region.

The present invention features the use of treatments such as UV radiation, a plasma treatment or an ion implantation to increase the dielectric constant of the dielectric layer in the second region, while the dielectric constant of the dielectric layer in the first region remains the same. In this way, the dielectric layer in the first region maintains a low dielectric constant to prevent RC delay raised between the metal interconnection. The dielectric constant of the dielectric layer in the second region is increased to improve the capacitance of the metal capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
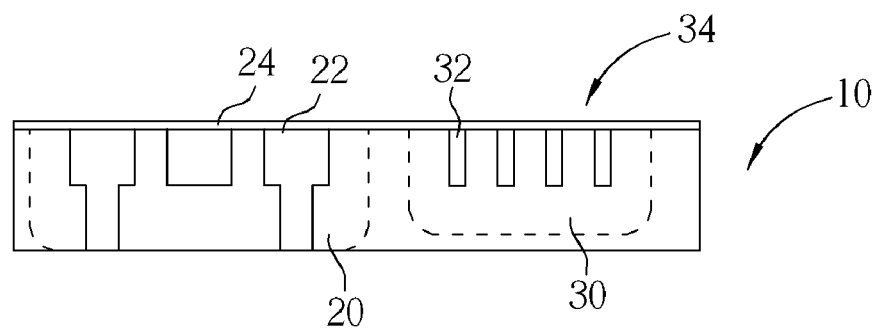
FIG. 1 to FIG. 4 are schematic diagrams depicting a method of fabricating a metal capacitor.

FIG. 1 to FIG. 4 are schematic diagrams depicting a method of fabricating a metal capacitor. As shown in FIG. 1, a dielectric layer 10 is provided. A first region 20 and a second region 30 are positioned on the dielectric layer 10.

The dielectric layer 10 can be formed on a semiconductor substrate (not shown) such as a silicon wafer, a silicon on insulator (SOI), a silicon on sapphire (SOS), a silicon on zirconia (SOZ), a doped or undoped semiconductor, a silicon epitaxial layer supported by a semiconductor substrate, or the like. The semiconductor is not limited to silicon, but also can be silicon-germanium, germanium, or germanium arsenide.

The dielectric layer 10 is a material that has a low dielectric constant, such as FLARE™, SiLK™, poly(arylene ether) polymer, parylene compounds, polyimide, fluorinated polyimide, hydrogen silsesquioxane (HSQ), methylsilsesquioxane (MSQ), fluorinated silicon glass (FSG), silicon dioxide, nanoporous silica or teflon.

By performing an interconnect process, a metal interconnection 22 is formed in the first region 20 and a capacitor electrode 32 is simultaneously formed in the second region 30. One possible method of forming the metal interconnection 22 and the capacitor electrode 32 is illustrated as follows: first, a single-damascene opening or a dual-damascene opening is formed in the dielectric layer 10 in the first region 20 and a capacitor electrode trench is formed in the dielectric layer 10 in the second region 20 by the lithography process and etching process, etc. After that, copper, or other metal with low resistance, is deposited in the capacitor electrode trench positioned in the second region 30, and the damascene opening positioned in the first region 20. In this way, the metal interconnection 22 such as a single-damascene interconnection or a dual-damascene interconnection can be formed in the first region 20 and the capacitor electrode 32 can be formed in the second region 30. Finally, copper is planarized by a chemical mechanical polishing (CMP) process. At this point, the dielectric layer 10 in the second region 30 and the capacitor electrode 32 constitute a metal capacitor 34. In addition, a barrier (not shown) such as Ti, TiN, TaN, WN, or the like can be formed before the metal interconnection 22 in order to prevent the diffusion of copper. Furthermore, a cap layer 24 such as a silicon nitride can be formed on the metal interconnection 22 to avoid copper or other metals diffusing into a dielectric layer directly covering the metal interconnection 22. As fabricating process of the barrier and the cap layer should be familiar to those skilled in the art, further description of the process is omitted for brevity.

According to different designs, the capacitor electrode 32 in the second region 30 can be at least two comb-like structures positioned opposite to each other or other patterns complementary in their shapes. The capacitor electrode 32 can also be arranged to provide a stacked structure after combining a set of capacitor electrodes formed in different dielectric layers.

Figure 2:
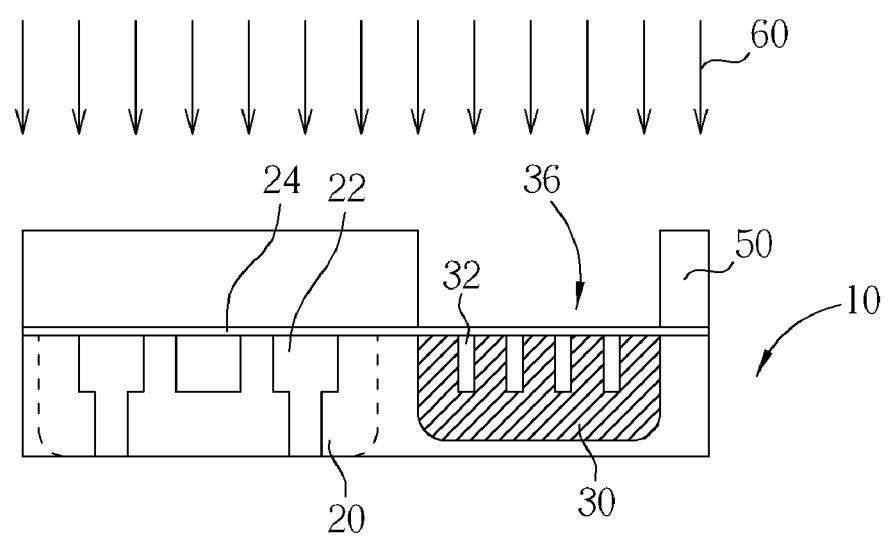

Then, as shown in FIG. 2, a mask such as a photomask 50 is formed to cover the first region 20 and the second region 30 is exposed through the photomask 50. After that, a treatment 60 is performed to make the dielectric constant of the dielectric layer 10 in the second region 30 higher than the dielectric constant of the dielectric layer 10 in the first region 20. At this point, the dielectric layer 10 in the second region 30 and the capacitor electrode 32 constitute a metal capacitor 36 such as a MOM capacitor with a higher capacitance.

Figure 3:
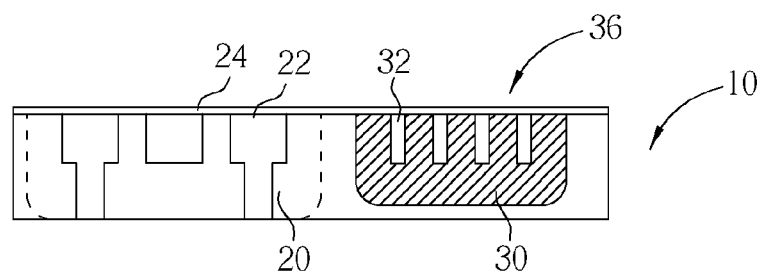

The treatment 60 may be UV radiation, a plasma treatment or an ion implantation. The dielectric constant of the dielectric layer 10 in the second region 30 and the depth of dielectric layer 10 which is influenced by the treatment 60 can be adjusted by controlling duration of the treatment 60, energy of the treatment 60 or dosage of the treatment 60. Furthermore, based on different dielectric materials, different treatments can be used to increase the dielectric constant. According to a preferred embodiment of the present invention, after the treatment 60 is performed, the dielectric constant of the dielectric layer 10 in the second region 30 is at least 10% higher than the dielectric constant of the dielectric layer 10 in the first region 20. Finally, as shown in FIG. 3, the photomask 50 is removed.

According to another preferred embodiment of the present invention, the treatment 60 can also be applied to dielectric material 10 in the second region 30 before the metal interconnection 22 and the capacitor electrode 32 are formed. According to another preferred embodiment of the present invention, the treatment 60 can be replaced by the following method: removing the dielectric layer 10 in the second region 30 and filling the second region 30 by a dielectric material with a higher dielectric constant before the interconnection 22 and the capacitor electrode 32 are formed.

Figure 4:
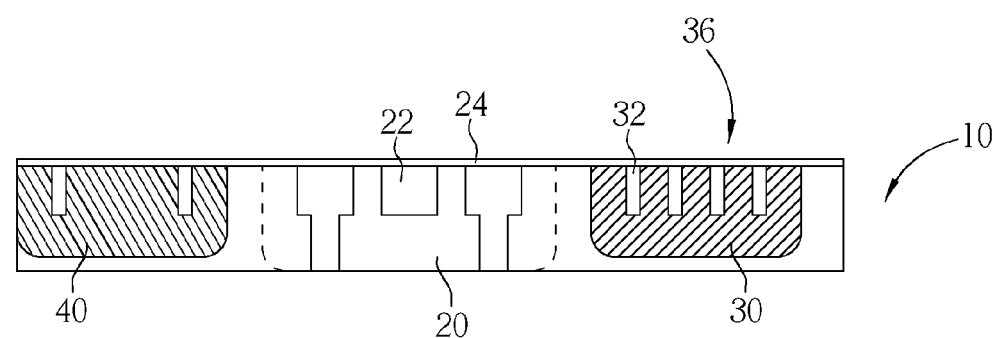

As shown in FIG. 4, a third region 40 can also be set on the dielectric layer 10. The third region 40 is a non-critical region such as a peripheral circuit, a logic IC or other iso-region (region having isolated patterns). Elements in the non-critical region can be formed by combining the interconnect process or other semiconductor processes. The treatment 60 can be performed on the dielectric layer 10 in the second region 30 and in the third region 40 simultaneously. Through the UV radiation, the plasma treatment or the ion implantation, the mechanical strength of the dielectric layer 10 in the third region 40 becomes greater than the mechanical strength of the dielectric layer 10 in the first region 20.

Figure 5:
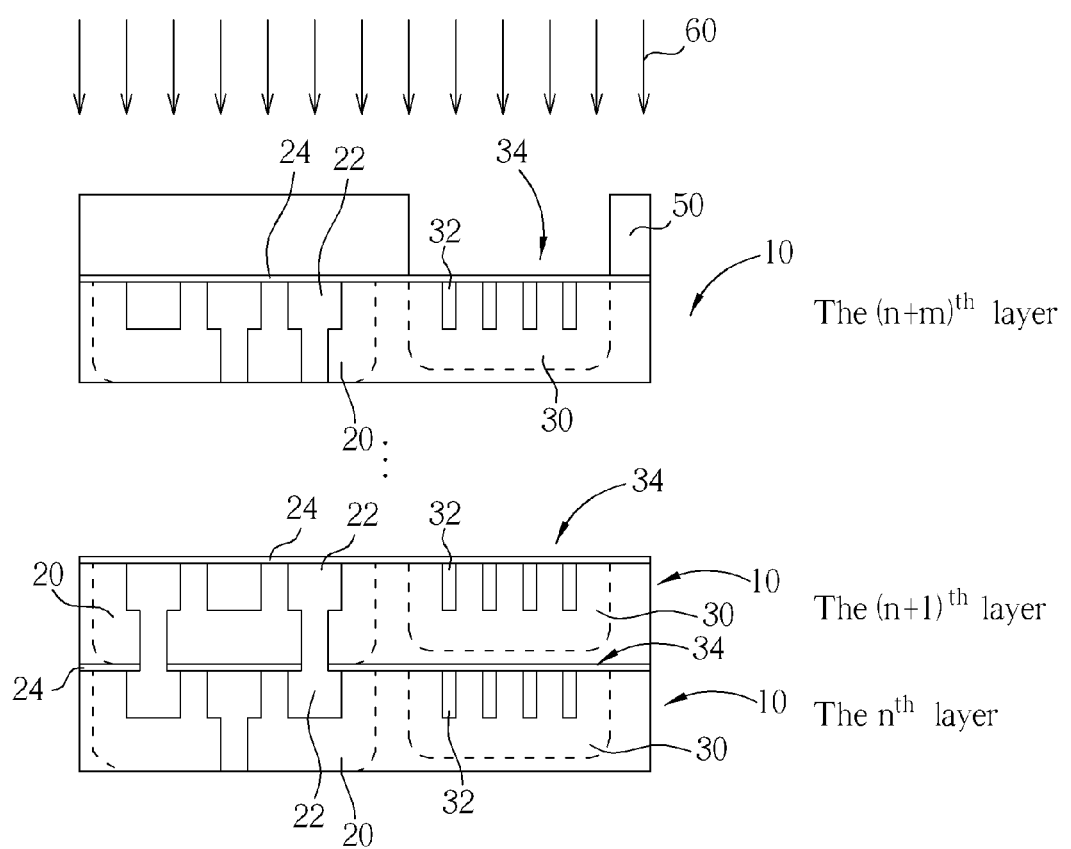
FIG. 5 shows a schematic diagram illustrating the treatment performed to a dielectric layer stack.

For a dielectric layer stack (structure formed by a plurality of dielectric layers), it is noteworthy that the treatment 60 can also be performed after each metal interconnection 22 and capacitor electrode 32 is formed in each dielectric layer. FIG. 5 shows a schematic diagram illustrating the treatment performed on a dielectric layer stack.

To simplify the illustration, a same numeral is designated for each same element. Assume the capacitor electrodes are formed in every dielectric layer from the $n^{th}$ layer to the $(n+m)^{th}$ layer. As shown in FIG. 5, the metal interconnection 22 and the metal capacitor 34 are formed in the $n^{th}$, $(n+1)^{th}$ . . . $(n+m)^{th}$ layer. After that, a mask such as a photomask 50 is formed on the $(n+m)^{th}$ layer. Then, the treatment 60 is performed. By adjusting energy of the UV radiation, the plasma treatment or the ion implantation, the dielectric constant in the second region 30 in every dielectric layer can be increased: for instance, implanting ions into the $(n+m)^{th}$ layer with strongest energy, implanting ions into the $(n+1)^{th}$ layer with stronger energy and implanting ions into the $n^{th}$ layer with weak energy. In another example, the UV radiation is performed for longer period of time to irradiate the $n^{th}$, $(n+1)^{th}$ . . . $(n+m)^{th}$ layers. The advantage of this embodiment is that, instead of performing the treatment 60 immediately after the metal interconnection 22 and the metal capacitor 34 are formed in one dielectric layer, the treatment 60 can be performed by using only one photomask 50 when all the interconnections 22 and the metal capacitor 34 are formed in every dielectric layer. In this way, the product cost can be reduced.

The above-mentioned method is not limited to be utilized on the MOM capacitor. After adjusting the fabricating steps, the present invention can be applied to the MIS capacitor or the MIM capacitor. In addition, the dielectric layer 10 is not limited to be formed on the semiconductor substrate; other material which can support the dielectric layer 10 such as a PCB can also be used.

The feature of the present invention is that a second region 30 is set on the dielectric layer 10 having a low dielectric constant. By performing the treatment 60 on the second region 30, the dielectric constant of the dielectric layer 10 in the second region 30 can be increased while the dielectric constant of the dielectric layer 10 in the first region 30 is maintained the same. That is, the dielectric layer 10 surrounding the metal interconnection 22 still has a low dielectric constant. Therefore, the RC delay can be prevented and the capacitance of the metal capacitor 34 is increased. In addition, the mechanical strength of the dielectric layer 10 in the third region 40 (non-critical region) is increased after the treatment 60. Therefore, the non-critical region can avoid damage during the following fabricating steps such as package or wire bonding.

A metal capacitor is also provided in the present invention. As shown in FIG. 4, a metal capacitor structure includes a dielectric layer 10 having a first region 20, a second region 30 and a third region 40. The dielectric layer 10 is a material having a low dielectric constant such as FLARE™, SiLK™, poly(arylene ether) polymer, parylene compounds, polyimide, fluorinated polyimide, hydrogen silsesquioxane (HSQ), methylsilsesquioxane (MSQ), fluorinated silicon glass (FSG), silicon dioxide, nanoporous silica or teflon.

The dielectric constant of the dielectric layer 10 in the second region 30 is higher than the dielectric constant of the dielectric layer 10 in the first region 20. The mechanical strength of the dielectric layer 10 in the third region 40 is greater than the mechanical strength of the dielectric layer 10 in the first region 20. The metal capacitor further includes a metal interconnection 22 positioned in the first region 20, a capacitor electrode 32 positioned in the second region 30 and a non-critical region such as a peripheral circuit, a logic IC or other iso-region positioned in the third region 40. A cap layer 24 such as silicon nitride can optionally cover the metal interconnection 22.

In addition, the capacitor electrode 32 and the dielectric layer 10 in the second region 30 constitute a metal capacitor 36 such as a MOM capacitor. The metal interconnection 22 can be a single-damascene interconnection or a dual-damascene interconnection. Furthermore, the dielectric layer 10 can be positioned on a semiconductor substrate such as a silicon wafer, a silicon on insulator (SOI), a silicon on sapphire (SOS), a silicon on zirconia (SOZ), a doped or undoped semiconductor, a silicon epitaxial layer supported by a semiconductor substrate, or the like.

All in all, in order to avoid the parasitic capacitance between the metal interconnection, the dielectric layer with low dielectric constant is often used. However, to increase the capacitance of the metal capacitor, a special fabricating method and a novel dielectric layer structure is provided in the present invention. That is, the capacitor electrode is located in a region having a high dielectric constant, and the fabricating method of the capacitor electrode is integrated with the interconnect process. In one aspect, the RC delay can be avoided. In another aspect, the capacitance of the metal capacitor can be effectively increased. Furthermore, since the mechanical strength in the non-critical region is increased, a better support is provided for the elements on the non-critical region for following processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a metal capacitor, comprising:
providing a dielectric layer having a first region, a second region, and a third region;
after forming the dielectric layer forming a dual damascene metal interconnection in the first region and forming a damascene capacitor electrode in the second region; and
performing a treatment on the dielectric layer in the second region to make a dielectric constant of the dielectric layer in the second region higher than a dielectric constant of the dielectric layer in the first region, wherein the treatment is performed on the second region and the third region of the dielectric layer simultaneously to improve the mechanical strength of the third region wherein each of the regions is spaced apart from the other regions.

2. The method of claim 1, wherein the treatment comprises a UV radiation, a plasma treatment or an ion implantation.

3. The method of claim 2, wherein the dielectric constant of the dielectric layer in the second region can be adjusted by controlling duration of the treatment, energy of the treatment or dosage of the treatment.

4. The method of claim 1, wherein the treatment is performed after the dual damascene metal interconnection and the damascene capacitor electrode are formed.

5. The method of claim 1, wherein the treatment is performed after a mask is formed on the first region and the second region is exposed through the mask.

6. The method of claim 1, wherein the third region comprises a non-critical region.

7. The method of claim 1, wherein the dual damascene metal interconnection and the damascene capacitor electrode are formed by a damascene process.

8. The method of claim 1, wherein a cap layer is positioned on the dual damascene metal interconnection.

9. The method of claim 1, wherein the damascene capacitor electrode and the dielectric layer in the second region constitute a metal-oxide-metal (MOM) capacitor.

10. The method of claim 6, wherein the third region is a peripheral circuit region.

11. The method of claim 6, wherein the third region is a logic IC region.

12. The method of claim 6, wherein the third region is an iso-region with isolated patterns.

* * * * *